(12) United States Patent
Niu et al.

(10) Patent No.: US 12,408,463 B2
(45) Date of Patent: Sep. 2, 2025

(54) TRENCH BALANCE STRUCTURE PATTERN IN RED PHOTODIODES OF A PIXEL ARRAY WITH QUAD BAYER COLOR FILTER

(71) Applicant: OMNIVISION TECHNOLOGIES, INC., Santa Clara, CA (US)

(72) Inventors: Chao Niu, Santa Clara, CA (US); Yuanwei Zheng, San Jose, CA (US); Zhiqiang Lin, Fremont, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 353 days.

(21) Appl. No.: 18/180,731

(22) Filed: Mar. 8, 2023

(65) Prior Publication Data

US 2024/0304642 A1   Sep. 12, 2024

(51) Int. Cl.
*H10F 39/00* (2025.01)
*H04N 25/78* (2023.01)
*H10F 39/18* (2025.01)

(52) U.S. Cl.
CPC ......... *H10F 39/807* (2025.01); *H04N 25/78* (2023.01); *H10F 39/1825* (2025.01); *H10F 39/8053* (2025.01); *H10F 39/8063* (2025.01); *H10F 39/182* (2025.01)

(58) Field of Classification Search
CPC ............ H10F 39/8053; H10F 39/1825; H10F 39/8063; H10F 39/807; H10F 39/182; H10F 39/199; H04N 25/134; H04N 25/779; H04N 25/78
See application file for complete search history.

(56) References Cited

U.S. PATENT DOCUMENTS

| | | |
|---|---|---|
| 10,461,109 B2 | 10/2019 | Wu et al. |
| 10,714,522 B2 | 7/2020 | Choi et al. |
| 11,335,718 B2 | 5/2022 | Zang et al. |
| 2020/0404203 A1 | 12/2020 | Jung et al. |
| 2021/0134863 A1 | 5/2021 | Suzuki |
| 2021/0144321 A1 | 5/2021 | Yamashita et al. |
| 2022/0020790 A1 | 1/2022 | Zang et al. |
| 2022/0130876 A1 | 4/2022 | Park et al. |

*Primary Examiner* — Scott B Geyer
(74) *Attorney, Agent, or Firm* — Dorsey & Whitney LLP

(57) ABSTRACT

A pixel array includes 2×2 groupings of photodiodes to generate image charge in response to incident light directed through a back side of the semiconductor layer. A Quad Bayer filter is disposed over the back side of the semiconductor layer over the 2×2 groupings of photodiodes. Each color filter of the Quad Bayer CFA is disposed over a respective one of the plurality of 2×2 groupings of photodiodes. Trench balance structures are disposed in the semiconductor layer. Each of the trench balance structures is disposed in the semiconductor layer between one of the photodiodes and a respective one of the red color filters of the Quad Bayer filter. None of the trench balance structures are disposed between any of the photodiodes and respective green color filters or blue color filters of the Quad Bayer filter.

30 Claims, 8 Drawing Sheets

TRENCH BALANCE STRUCTURE PATTERN IN RED PHOTODIODES OF A PIXEL ARRAY WITH QUAD BAYER COLOR FILTER

BACKGROUND INFORMATION

Field of the Disclosure

This disclosure relates generally to image sensors, and in particular but not exclusively, relates to image sensors with pixel arrays with Quad Bayer color filters.

Background

Image sensors have become ubiquitous and are now widely used in digital cameras, cellular phones, security cameras, as well as in medical, automotive, and other applications. As image sensors are integrated into a broader range of electronic devices, it is desirable to enhance their functionality, performance metrics, and the like in as many ways as possible (e.g., resolution, power consumption, dynamic range) through both device architecture design as well as image acquisition processing. The technology used to manufacture image sensors has continued to advance at a great pace. For example, the demands of higher resolution and lower power consumption have encouraged the further miniaturization and integration of these devices.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to produce digital images (e.g., image data) representing the external scene. The analog image signals on the bitlines are coupled to readout circuits, which include input stages having analog-to-digital conversion (ADC) circuits to convert those analog image signals from the pixel array into the digital image signals.

BRIEF DESCRIPTION OF THE DRAWINGS

Non-limiting and non-exhaustive embodiments of the present disclosure are described with reference to the following figures, wherein like reference numerals refer to like parts throughout the various views unless otherwise specified.

Figure 1:
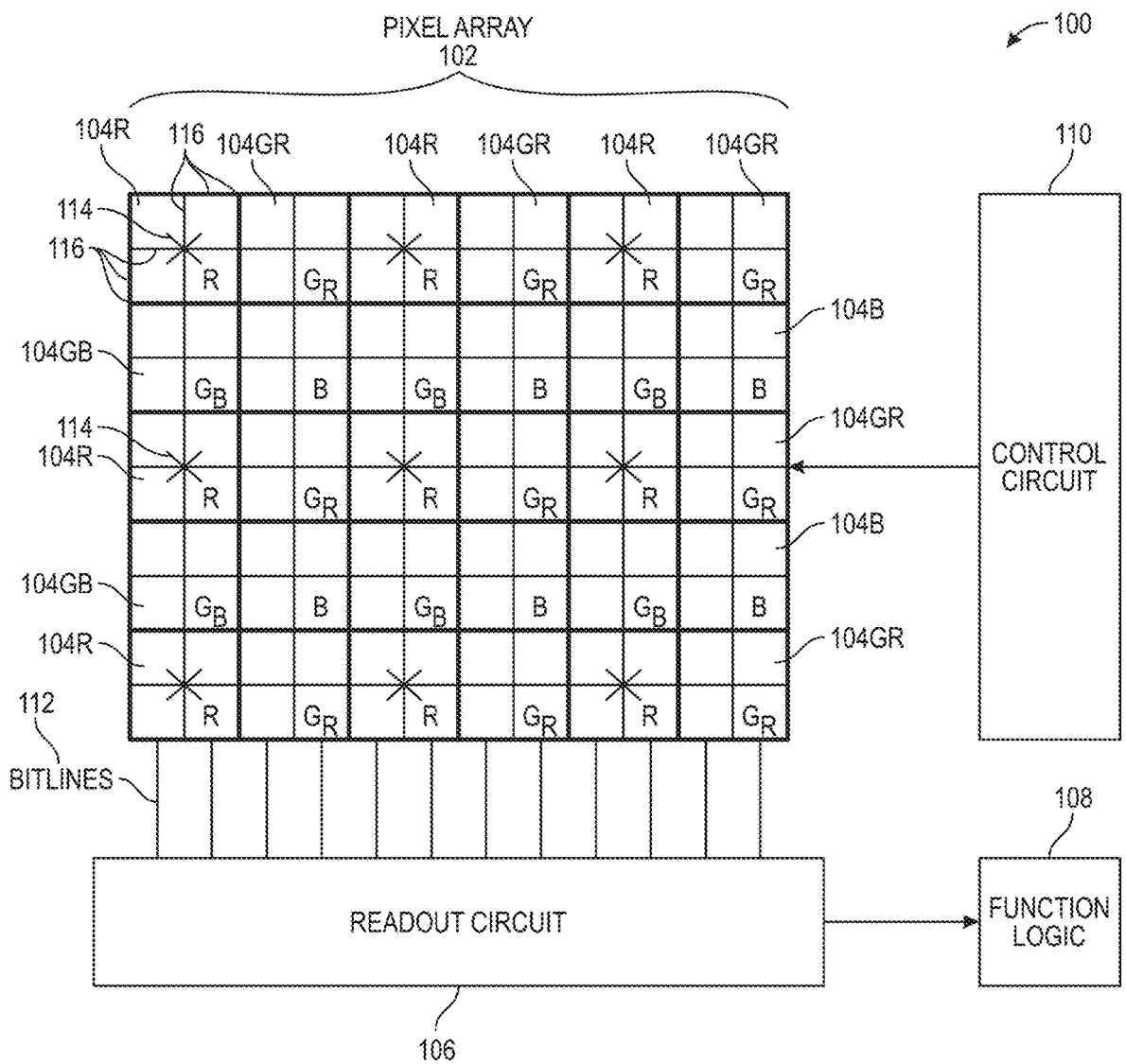
FIG. 1 illustrates one example of an imaging system with example patterns of trench balance structures included with 2×2 groupings of photodiodes under red color filters of a Quad Bayer filter over a pixel array in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. In addition, common but well-understood elements that are useful or necessary in a commercially feasible embodiment are often not depicted in order to facilitate a less obstructed view of these various embodiments of the present disclosure.

DETAILED DESCRIPTION

Example patterns of trench balance structures are included with 2×2 groupings of photodiodes under color filters for sensing light having wavelengths greater than or equal to 600 nanometer with a Quad Bayer filter disposed over a pixel array are described in accordance with the teachings of the present disclosure. Examples of Quad Bayer filters may include for instance a Red-Green-Green Blue (e.g., a RGGB pattern) Quad Bayer filter pattern, a Red-Green-Blue-infrared (e.g., a RGB-IR pattern) Quad Bayer filter, or the like. Various examples directed to example imaging systems with patterns of trench balance structures included with 2×2 groupings of photodiodes under red color filters of a Quad Bayer filter over a pixel array are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present disclosure. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein are interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system with patterns of trench balance structures included with 2×2 groupings of photodiodes under red color filters of a Quad Bayer filter over a pixel array are disclosed. An example Quad Bayer filter may include a plurality of minimum repeating units of a red color filter, two green color filters, and a blue color filter that is repeated over the surface of the pixel array thereby producing either a red pixel, a green pixel, or a blue pixel at each corresponding pixel location.

In the various examples, the balance of $G_B G_R$ signal crosstalk between 2×2 groupings of photodiodes under red color filters (R) to neighboring 2×2 groupings of photodiodes under green color filters ($G_B$) in the same row as the blue color filters (e.g., green-blue ($G_B$) color filters) and to neighboring 2×2 groupings of photodiodes under green color filters ($G_R$) in the same row as the red color filters (e.g., green-red ($G_R$) color filters) is improved with example trench balance structures in accordance with the teachings of the present disclosure by absorbing, scattering, reflecting, and/or refracting, etc., light that is directed to the groupings of photodiodes under red color filters, which therefore reduces signal sensing differences between 2×2 groupings of photodiodes under green color filters ($G_B$) and 2×2 groupings of photodiodes under green color filters ($G_R$) that neighbor 2×2 groupings of photodiodes under red color filters (R) in accordance with the teachings of the present disclosure.

As will be discussed, in various examples, the trench balance structures are disposed in a semiconductor layer between a respective one of the photodiodes and a respective one of the red color filters of a Quad Bayer color filter array (CFA). In the examples, none of the trench balance structures are disposed between any of the photodiodes and respective green color filters or blue color filters of the Quad Bayer CFA. In various examples, each of the trench balance structures extends from a central region of a respective opening in an isolation grid towards a center of a respective 2×2 grouping of photodiodes under a red color filter. In some examples, the trench balance structure is separated from an intersection of deep trench isolation (DTI) grid structures at the center of the respective 2×2 grouping of photodiodes by a central gap distance greater than or equal to zero. In other examples, each of the trench balance structures extends from a central region of a respective opening in the isolation grid towards first and second sides of the respective opening in the isolation grid of the 2×2 grouping of photodiodes under a red color filter. In some examples, the trench balance structure is separated from the first and second sides of the respective opening by lateral gap distances greater than or equal to zero. In some examples, the trench balance structure is structurally integrated with inner DTI grid structures that provide isolation among photodiodes within the respective 2×2 grouping of photodiodes.

To illustrate, FIG. 1 illustrates one example of a complementary metal oxide semiconductor (CMOS) imaging system 100 with example patterns of trench balance structures included with 2×2 groupings of photodiodes under red color filters of a Quad Bayer filter over a pixel array in accordance with the teachings of the present disclosure. As shown in the depicted example, the imaging system 100 includes an image sensor with pixel array 102, a control circuit 110, a readout circuit 106, and function logic 108. In one example, pixel array 102 is a two-dimensional (2D) array of pixel cells arranged into 2×2 groupings of photodiodes. In the examples, a Quad Bayer color filter array (CFA) is disposed over a back side of a semiconductor layer over the plurality of 2×2 groupings of photodiodes. The Quad Bayer CFA includes a plurality of color filters, including red color filters, green color filters, and blue color filters, with each color filter of the Quad Bayer CFA is disposed over a respective one of the plurality of 2×2 groupings of photodiodes. In the depicted example, 2×2 groupings of photodiodes under red color filters are labeled 104R, 2×2 groupings of photodiodes under blue color filters are labeled 104B, 2×2 groupings of photodiodes under green color filters in the same row as red color filters are labeled 104GR (e.g., first green color filters), and 2×2 groupings of photodiodes under green color filters in the same row as blue color filters are labeled 104GB (e.g., second green color filters). As will be discussed in greater detail below, a plurality of trench balance structures 114 is disposed in the semiconductor layer with each one of the plurality of trench balance structures 114 disposed in the semiconductor layer between a respective photodiode and a respective one of the red color filters of the Quad Bayer CFA. In the various examples, none of the plurality of trench balance structures 114 is disposed between any of the photodiodes and respective green color filters ($G_R$ and/or $G_B$) or blue color filters of the Quad Bayer CFA.

In the depicted example, the photodiodes included in the 2×2 groupings of photodiodes 104R, 104B, 104GR, 104GB arranged in rows and columns of the pixel array 102 to acquire image data of a person, place, object, etc., which can then be used to render an image of a person, place, object, etc. As will be discussed, a plurality of deep trench isolation (DTI) grid structures is disposed in the semiconductor layer of the pixel array 102 and arranged to form an isolation grid in the semiconductor layer. A plurality of openings is defined by the isolation grid with each one of the photodiodes isolated within a respective one of a plurality of openings defined in the isolation grid. In the various examples, the balance of $G_B G_R$ signal crosstalk between 2×2 groupings of photodiodes under red color filters (R) 104R to neighboring 2×2 groupings of photodiodes under green color filters ($G_B$) in the same row as the blue color filters (e.g., green-blue ($G_B$) color filters) and to neighboring 2×2 groupings of photodiodes under green color filters ($G_R$) in the same row as the red color filters (e.g., green-red ($G_R$) color filters) is improved by absorbing, scattering, reflecting, and/or refracting, etc., light in accordance with the teachings of the present disclosure.

After the photodiodes included in the 2×2 groupings of photodiodes 104R, 104B, 104GR, 104GB have acquired their image charge, the corresponding analog image signals are read out by readout circuit 106 through column bitlines 112. In the various examples, readout circuit 106 includes an analog-to-digital conversion (ADC) circuit, which is coupled to convert the analog image signals received from the photodiodes included in the 2×2 groupings of photodiodes 104R, 104B, 104GR, 104GB through bitlines 112 to digital image signals, which may be then transferred to function logic 108. Function logic 108 may simply store the image data or even manipulate the image data by applying post image processing or effects. Such image processing may, for example, include image processing, image filtering, image extraction and manipulation, determination of light intensity, crop, rotate, remove red eye, adjust brightness, adjust contrast, etc.

In one example, a control circuit 110 is coupled to pixel array 102 to control operational characteristics of pixel array 102. For instance, in one example, control circuit 110 generates the transfer gate signals and other control signals to control the transfer and readout of image data from all of the pixel cells 104 of pixel array 102. In addition, control circuit 110 may generate a shutter signal for controlling image acquisition. In one example, the shutter signal is a rolling shutter signal such that each row of the pixel array 102 is read out sequentially row by row during consecutive acquisition windows. The shutter signal may also establish an exposure time, which is the length of time that the shutter remains open. In one embodiment, the exposure time is set to be the same for each of the frames.

Figure 2A:
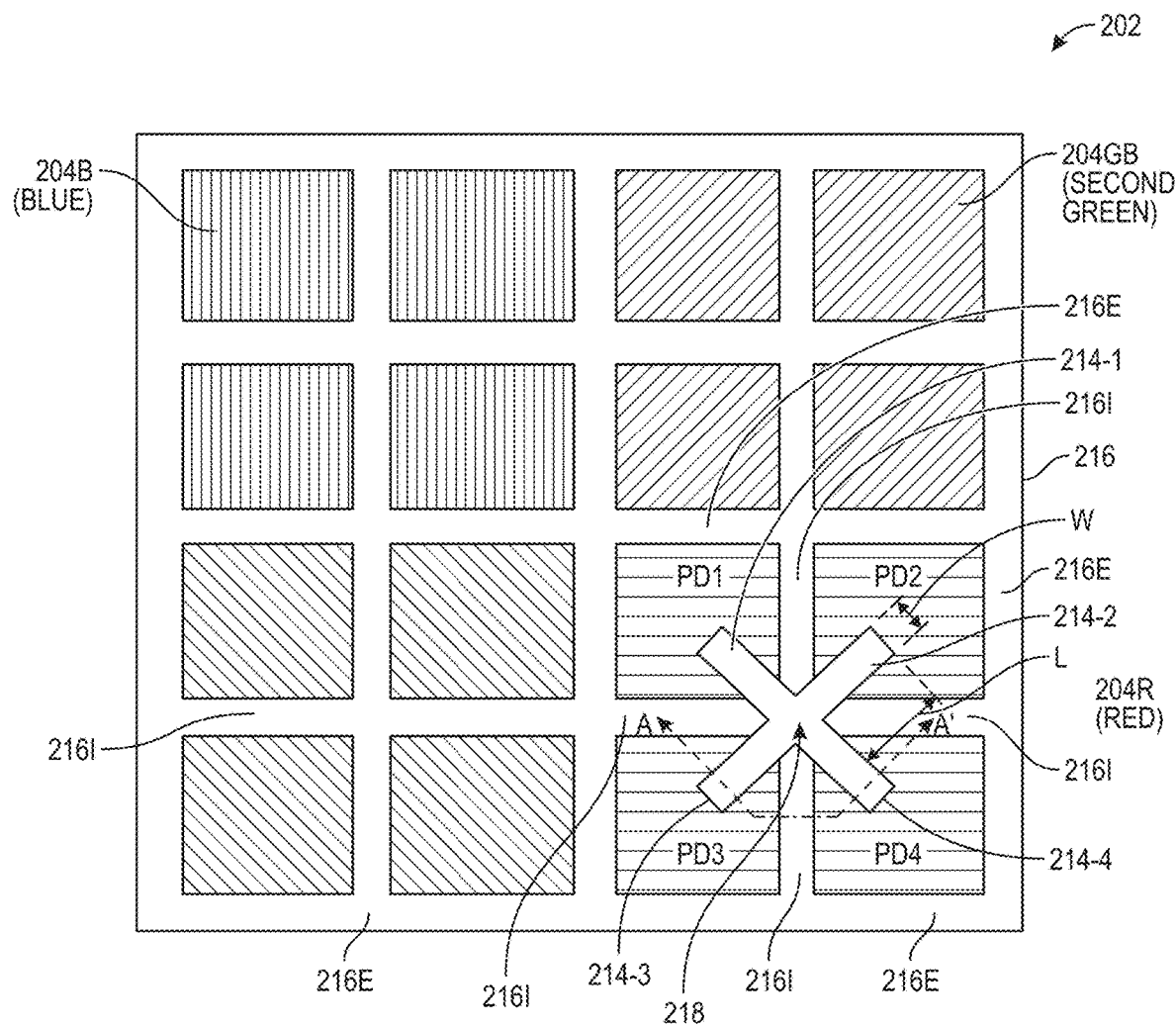
FIG. 2A is top view illustrating one example of neighboring 2×2 groupings of photodiodes of a pixel array under red, green, and blue color filters of a Quad Bayer filter in accordance with the teachings of the present disclosure.
Figure 2B:
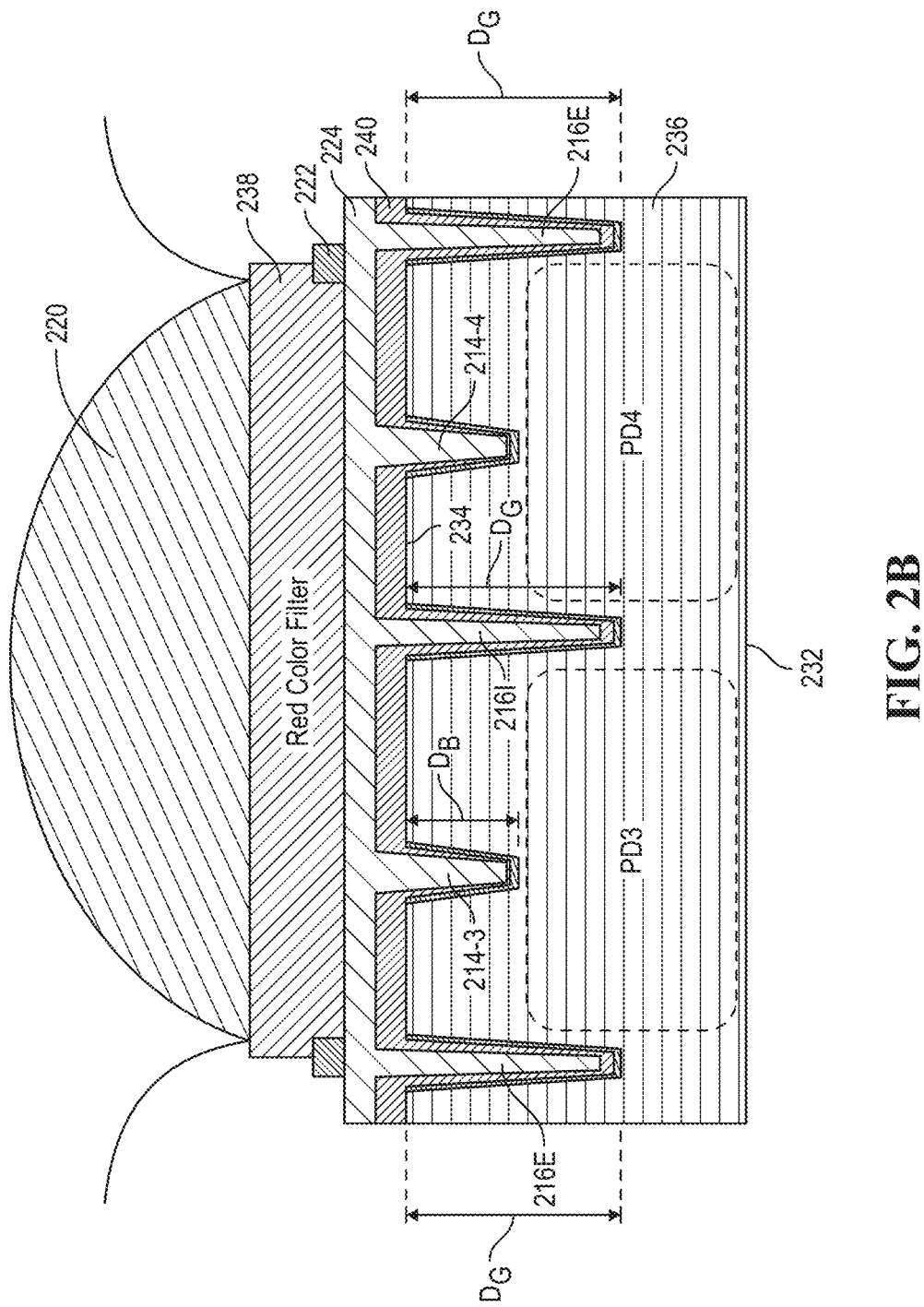
FIG. 2B is an example cross-section view of a 2×2 grouping of photodiodes of a pixel array with example trench balance structures under a red color filter of a Quad Bayer filter as illustrated in FIG. 2A in accordance with the teachings of the present disclosure.

FIGS. 2A-2B illustrate 2×2 groupings of photodiodes of a pixel array with a Quad Bayer filter in accordance with the teachings of the present disclosure. In particular, FIG. 2A is top view illustrating one example of neighboring 2×2 groupings of photodiodes of a pixel array 202 under red, green, and blue color filters of a Quad Bayer filter. FIG. 2B is an example cross-section view through dashed line A-A' of FIG. 2A through two of the trench balance structures 214-3 and 214-4 and two of the photodiodes PD3 and PD4 of the 2×2 grouping of photodiodes 204R under a red color filter 238 of pixel array 202 in accordance with the teachings of the present disclosure. It is noted that the example 2×2 groupings of photodiodes illustrated in FIGS. 2A-2B may be examples of one or more of the 2×2 groupings of photodiodes of the example pixel array 102 of FIG. 1, and it should be appreciated that similarly named and numbered elements referenced below are coupled and function as described above.

As shown in the example depicted in FIG. 2A, a 2×2 grouping of photodiodes 204B is disposed under a blue color filter of the Quad Bayer filter, a 2×2 grouping of photodiodes 204GB is disposed under a green color filter in the same row as a blue color filter of the Quad Bayer filter, a 2×2 grouping of photodiodes 204R is disposed under a red color filter of the Quad Bayer filter, and a 2×2 grouping of photodiodes 204GR is disposed under a green color filter in the same row as a red color filter of the Quad Bayer filter. In the example, a 2×2 grouping of photodiodes 204GR disposed under a green color filter (e.g., first green color filter) is adjacent to a respective one of the 2×2 groupings of photodiodes 204R disposed under the red color filter in the same row. A 2×2 grouping of photodiodes 204GB disposed under a green color filter (e.g., second green color filter) is adjacent to a respective one of 2×2 groupings of photodiodes 204B disposed under the blue color filter in the same row. The 2×2 grouping of photodiodes 204GB disposed under the green color filter (e.g., second green color filter) is adjacent to a respective one of 2×2 groupings of photodiodes 204R disposed under the red color filter in the same column.

As shown in the depicted example, a plurality of DTI grid structures 216 is disposed in a semiconductor layer 236 proximate to a back side 234 of the semiconductor layer 236 and arranged to form an isolation grid in the semiconductor layer 236. In some embodiments, the semiconductor layer 236 is a silicon wafer or substrate, a silicon germanium alloy, germanium, a silicon carbide alloy, an indium gallium arsenide alloy, any other alloys formed of III-V compounds, other semiconductor materials or alloys, combinations thereof or bulk substrate. In some embodiments, the semiconductor layer 236 is an epitaxial layer grown on or otherwise disposed on a semiconductor substrate or a wafer substrate. In the example, a plurality of openings are defined by the isolation grid 216. As shown, the back side 234 of semiconductor layer 236 is opposite a front side 232 of semiconductor layer 236. In the example, each one of the photodiodes (e.g., PD1, PD2, PD3, PD4) is configured to be illuminated with incident light that is directed through the back side 234 of the semiconductor layer 236 through a microlens 220 and a color filter, such as red color filter 238 as illustrated. In the depicted example, the red color filter 238 is illustrated as being disposed in an opening of a metal grid 222 that is disposed over a filling material 224 and external side DTI grid structures 216E, which will be described in greater detail below. In the various examples, metal grid 222 helps provide optical isolation between adjacent 2×2 groupings of photodiodes in the pixel array. For example, metal grid 222 helps provide optical isolation between 2×2 groupings of photodiodes under red color filter 238 and adjacent 2×2 groupings of photodiodes under green color filters (e.g., 2×2 grouping of photodiodes 204GR or 204GB). In various examples, microlens 220 is one of a plurality of microlenses included in a microlens array disposed over the Quad Bayer filter over the back side 234 of the semiconductor layer 236. In one example, there is one microlens disposed over each 2×2 groupings of photodiodes or over each color filter of the Quad Bayer filter. In the example, each of the photodiodes is isolated in the semiconductor layer 236 within a respective one of the plurality of openings defined by the isolation grid 216.

In the example, a plurality of DTI grid structures 216 disposed in the semiconductor layer 236, which are arranged to form an isolation grid in the semiconductor layer. As shown in the depicted example, each of the plurality of DTI grid structures 216 is arranged to extend into the semiconductor layer 236 from the back side 234 and has a depth or a grid structure depth $D_G$ in the semiconductor layer 236 with respect to the back side 234 of the semiconductor layer 236. The depth $D_G$ in embodiments may be less than or equal to a thickness of the semiconductor layer 236, wherein the thickness of semiconductor layer 236 may range from 2.5 micrometers to 7 micrometers. In one example, the DTI grid structures 216 include a filling material 224 that disposed in semiconductor layer 236. In the example, a high-k lining material 240 is disposed between the filling material 224 and the semiconductor layer 236. In one embodiment, the filling material 224 may be further disposed on the back side 234 of the semiconductor layer 236 forming a processing buffer layer providing process protection to underlying layers. In various examples, the filling material 224 may include a dielectric material such as an oxide-based material, a low N material, a conductive material such as polysilicon, tungsten (W), aluminum (Al), or other material, or a combination of dielectric material and conductive material. A low N material may be referred to a material having refractive index being less than that of the semiconductor layer 236. In various examples, the high-k lining material 240 may include a passivation material, anti-reflective coating layer, or the like. In various examples, the high-k lining material 240 may be comprised of hafnium oxide, aluminum oxide, tantalum pentoxide, zinc oxide, and the like.

In the example, each one of the photodiodes (e.g., PD1, PD2, PD3, PD4) in each 2×2 grouping of photodiodes is isolated within a respective one of a plurality of openings defined by the isolation grid formed with DTI grid structures 216. For example, the isolation grid 216 may be arranged to provide electrical and/or optical isolation between a 2×2 grouping of photodiodes 204B and neighboring 2×2 groupings of photodiodes such as 2×2 groupings of photodiodes 204GR or 2×2 groupings of photodiodes 204GB. As shown in the example, each 2×2 grouping of photodiodes (e.g., 204B, 204GB, 204GR, 204R) is surrounded by external side DTI grid structures 216E, which form a "square" shape around each 2×2 grouping of photodiodes. In addition, interior side DTI grid structures 216I are formed inside of each 2×2 grouping of photodiodes, which form a "plus" shape and to isolate each of the photodiodes (e.g., PD1, PD2, PD3, PD4) from each other within the 2×2 grouping of photodiodes inside the "square" shape formed by external side DTI grid structures 216E. The DTI grid structures 216 in other embodiments may form different geometric shape such as pentagon, octagonal, triangular, and rectangular or the like. As shown in the example, a center 218 of a respective 2×2 grouping of photodiodes is located at an intersection of orthogonal interior side DTI grid structures 216I within each 2×2 grouping of photodiodes.

As shown in the depicted example, a plurality of trench balance structures 214-1, 214-2, 214-3, 214-4 is also disposed in the semiconductor layer. In the example, each one of the plurality of trench balance structures (e.g., 214-1, 214-2, 214-3, 214-4) is disposed in the semiconductor layer 236 between one of the photodiodes (e.g., PD1, PD2, PD3, PD4) within the 2×2 grouping of photodiodes and a respective one of the red color filters 238 of the Quad Bayer CFA. In addition, none of the plurality of trench balance structures (e.g., 214-1, 214-2, 214-3, 214-4) is disposed between any of the photodiodes and respective green color filters or blue color filters of the Quad Bayer CFA. It is appreciated therefore that each one of the plurality of trench balance structures (e.g., 214-1, 214-2, 214-3, 214-4) is disposed in the semiconductor layer between one of the plurality of 2×2 groupings of photodiodes (e.g., 204R) and a respective one of the red color filters, which is neighboring another one of the 2×2 groupings (e.g., 204GR) of photodiodes disposed beneath one of the green color filters (e.g., first green) in a same row of the pixel array.

As shown in the depicted example, each of the plurality of trench balance structures (e.g., 214-1, 214-2, 214-3, 214-4) is arranged to extend into the semiconductor layer 236 from the back side 234 and has a depth or a balance structure depth DB in the semiconductor layer 236 with respect to back side 234 of the semiconductor layer 236. In some embodiments, the depth DB is less than the respective depth of each the photodiodes PD1, PD2, PD3, and PD4 with respect to the back side 234 of the semiconductor layer 236. In some embodiments, each of the plurality of trench balance structures (e.g., 214-1, 214-2, 214-3, 214-4) may partially extend into the respective photodiode region of corresponding photodiodes PD1, PD2, PD3, PD4. That is, each of the plurality of trench balance structures (e.g., 214-1, 214-2, 214-3, 214-4) may be in part surrounded by the respective photodiode region of corresponding photodiodes PD1, PD2, PD3, PD4. In various examples, the depth DB of the trench balance structures 214-1, 214-2, 214-3, 214-4 is less than or equal to the depth $D_G$ of the DTI grid structures 216 in the semiconductor layer 236 considering color separation within a pixel cell, processing, and $G_BG_R$ balance performance. In various examples, the depth DB may be in the range of 0.5 µm to 2 µm depending on the thickness of the semiconductor layer 236.

In one example, the trench balance structures 214-1, 214-2, 214-3, 214-4 include the same materials as the DTI grid structures 216. For instance, as shown in the depicted example, the trench balance structures 214-1, 214-2, 214-3, 214-4 include a filling material 224, which may include a dielectric material such as an oxide-based material, a low N material, a conductive material such as polysilicon, tungsten (W), aluminum (Al), or other material, or a combination of dielectric material and conductive material. In the various examples, a high-k lining material 240 is disposed between the filling material 224 and the semiconductor layer 236. In the various examples, the high-k lining material 240 may include a passivation material, anti-reflective coating layer, or the like. In one embodiment, the trench balance structures 214-1, 214-2, 214-3, 214-4 and the DTI grid structures 216 are structurally connected (e.g., formed at the same time in same lithography process sharing same photomask).

In examples without the trench balance structures 214-1, 214-2, 214-3, 214-4 under the red color filters, it is appreciated that at the horizontal edge under red light, crosstalk mainly happens from the red color channel to the green-red $G_R$ color channel along the horizontal direction at the horizontal edge, but not from the red color channel to the $G_B$ color channel causing the $G_BG_R$ difference or imbalance affecting image quality. The $G_BG_R$ difference may vary across the plurality of Quad pixels included in pixel array and such variation of $G_BG_R$ differences across pixel array occurs in relation of the chief ray angle. For example, minor or zero $G_BG_R$ differences may be found at the center of the pixel array where the chief ray angle is of 0 degrees, and $G_BG_R$ differences increases as the distance between the Quad pixel and the center of the pixel array increases, i.e., as the chief ray angle increases. However, with the trench balance structures 214-1, 214-2, 214-3, 214-4 under the red color filters, the balance of $G_BG_R$ signal crosstalk between 2×2 grouping of photodiodes 204R to neighboring 2×2 groupings of photodiodes 204GR under green color filters ($G_R$) and to neighboring 2×2 groupings of photodiodes 204GB under green color filters ($G_B$) is improved by absorbing, scattering, reflecting, and/or refracting, etc., light in accordance with the teachings of the present disclosure. That is, by absorbing, scattering, reflecting, and/or refracting light directed to 2×2 grouping of photodiodes under the red color filters with the trench balance structures 214-1, 214-2, 214-3, 214-4, signal differences between 2×2 grouping of photodiodes 204R to neighboring 2×2 groupings of photodiodes 204GR under green color filters ($G_R$) and to neighboring 2×2 groupings of photodiodes 204GB under green color filters ($G_B$), can be reduced in accordance with the teachings of the present disclosure.

Figure 3A:
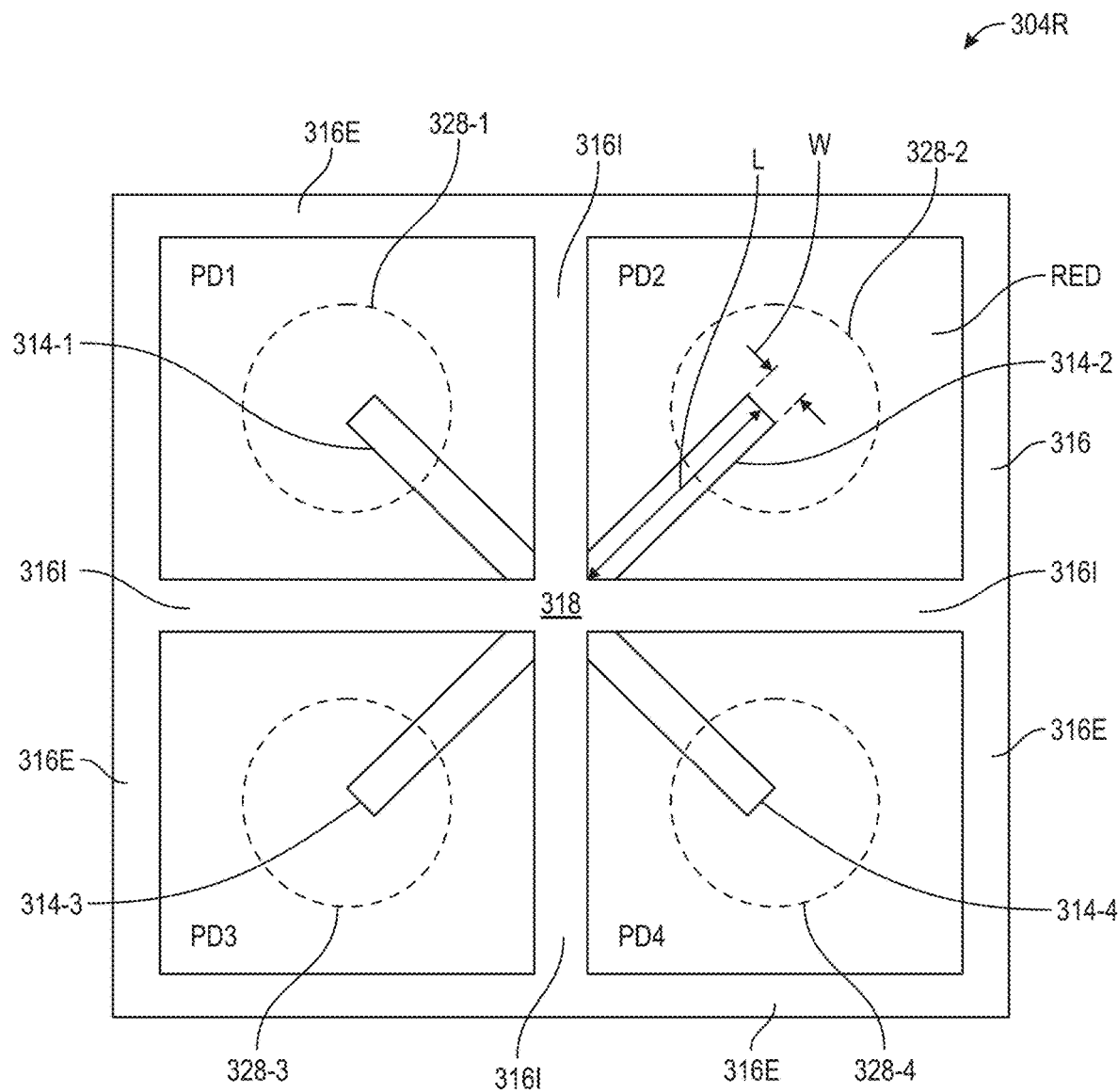
FIG. 3A is an example top view of a 2×2 grouping of photodiodes including one example of trench balance structures under a red color filter of a Quad Bayer filter in accordance with the teachings of the present disclosure.

FIG. 3A is an example top view illustrating increased detail of a 2×2 grouping of photodiodes 304R including one example of trench balance structures under a red color filter of a Quad Bayer filter in accordance with the teachings of the present disclosure. It is noted that the example 2×2 grouping of photodiodes 304R illustrated in FIG. 3A may be an example of the 2×2 grouping of photodiodes 204R of the example pixel array 202 of FIGS. 2A-2B or the 2×2 groupings of photodiodes 104R of the example pixel array 102 of FIG. 1 and it should be appreciated that similarly named and numbered elements referenced below are coupled and function as described above.

As shown in the depicted example, 2×2 grouping of photodiodes 304R includes a 2×2 arrangement of photodiodes PD1, PD2, PD3, PD4, which are included in a pixel array under a red color filter of a Quad Bayer filter disposed over the pixel array. In the example, the 2×2 arrangement of photodiodes PD1, PD2, PD3, PD4 is isolated within or surrounded by external side DTI grid structures 316E of isolation grid 316. Each of the photodiodes PD1, PD2, PD3, PD4 is isolated within respective openings defined by the external DTI grid structures 316E and the internal DTI grid structures 316I of isolation grid 316 as shown. A center 318 of the 2×2 grouping of photodiodes 304R is located at an intersection of orthogonal interior side DTI grid structures (e.g., the internal DTI grid structures 316I) within the 2×2 grouping of photodiodes 304R. The internal DTI grid structures 316I in embodiments refer to part of isolation grid 316 that provide isolation between the 2×2 grouping of photodiodes within the same quad pixel cell and the external DTI grid structures 316E provide isolation between adjacent 2×2 grouping of photodiodes.

As shown in the depicted example, a plurality of trench balance structures 314-1, 314-2, 314-3, 314-4 is disposed in the semiconductor layer. Each one of the plurality of trench balance structures 314-1, 314-2, 314-3, 314-4 is disposed in the semiconductor layer between a respective one of the photodiodes (e.g., PD1, PD2, PD3, PD4) and a respective one of the red color filters of the Quad Bayer CFA. In various examples, each trench balance structure 314-1, 314-2, 314-3, 314-4 that extends from a central region 328-1, 328-2, 328-3, 328-4 of a respective opening in the isolation grid 316 towards the center 318 of 2×2 grouping of photodiodes 304R. For instance, as shown in the depicted example, trench balance structure 314-1 extends from central region 328-1 to center 318, trench balance structure 314-2 extends from central region 328-2 to center 318, trench balance structure 314-3 extends from central region 328-3 to center 318, and trench balance structure 314-4 extends from central region 328-4 to center 318.

In various examples, each of the trench balance structures 314-1, 314-2, 314-3, 314-4 may have a length L (e.g., distance from the center 318 to the opposite ends of the respective trench balance structures) of for example approximately 0.3 μm to 0.5 μm for a 1 μm pixel. In various examples, each of the trench balance structures 314-1, 314-2, 314-3, 314-4 may have a length that varies depending of the distance of the respective pixel from the center region of the pixel array. In the various examples, the width W or critical dimension of each of the trench balance structures 314-1, 314-2, 314-3, 314-4 may be less than or equal to the width of the DTI grid structures 316I and 316E. In the various examples, the trench balance structures 314-1, 314-2, 314-3, 314-4 may be fabricated or formed with the same mask used to fabricate or form the DTI grid structures 316I and 316E or separately from used to fabricate or form the DTI grid structures 316I and 316E with a different mask.

In the depicted example, there is no gap or there is a central gap distance equal to zero between trench balance structures 314-1, 314-2, 314-3, 314-4 and the interior side DTI grid structures 316I at the center 318.

Figure 3B:
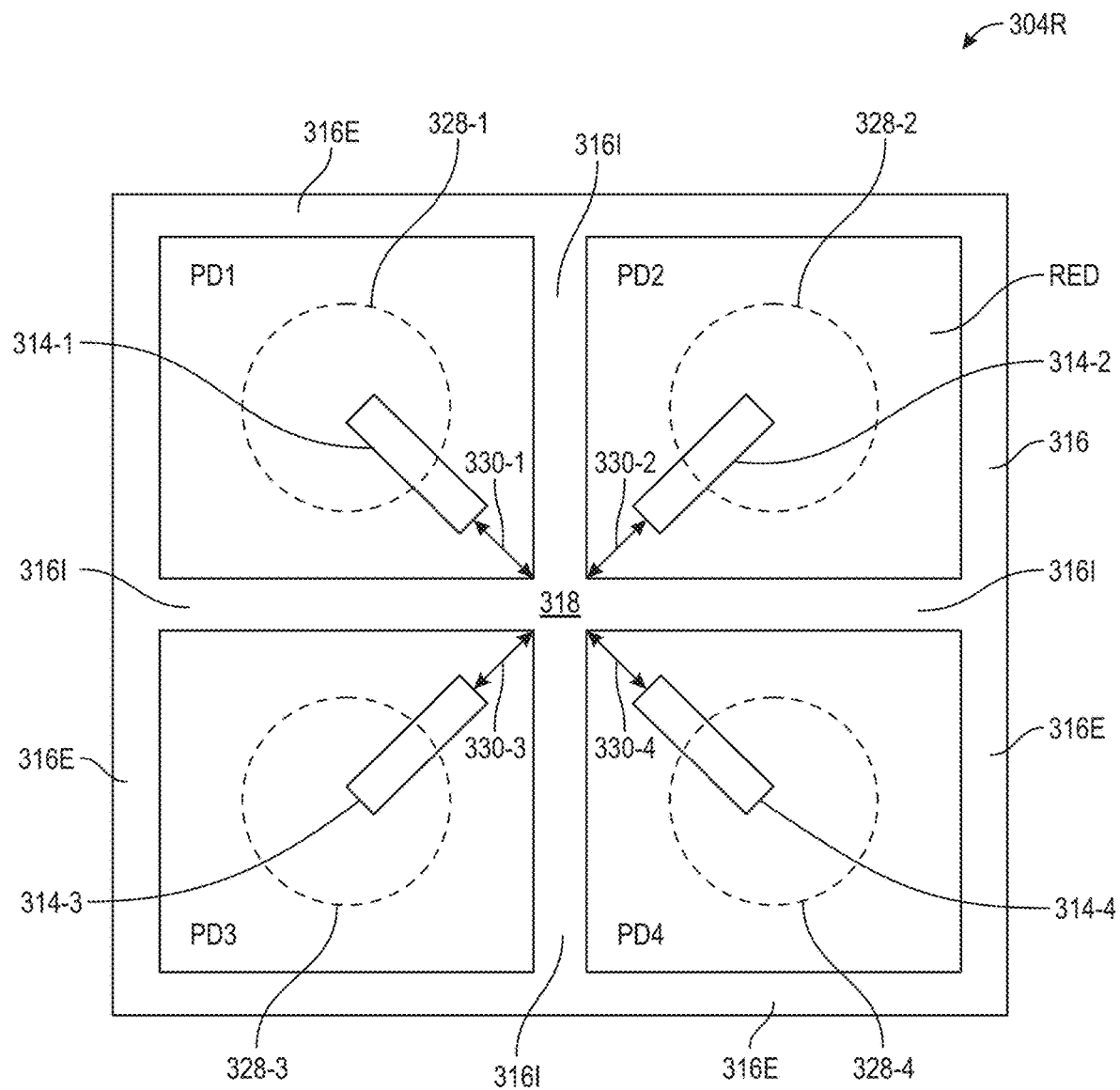
FIG. 3B is example top view of a 2×2 grouping of photodiodes including another example of trench balance structures under a red color filter of a Quad Bayer filter in accordance with the teachings of the present disclosure.

FIG. 3B is example top view illustrating increased detail of a 2×2 grouping of photodiodes 304R including another example of trench balance structures under a red color filter of a Quad Bayer filter in accordance with the teachings of the present disclosure. It is noted that the example 2×2 grouping of photodiodes 304R illustrated in FIG. 3B may be another example of the 2×2 grouping of photodiodes 204R of the example pixel array 202 of FIGS. 2A-2B or the 2×2 groupings of photodiodes 104R of the example pixel array 102 of FIG. 1 and it should be appreciated that similarly named and numbered elements referenced below are coupled and function as described above. It is further appreciated that the example 2×2 grouping of photodiodes 304R of FIG. 3B shares many similarities with the example 2×2 grouping of photodiodes 304R of FIG. 3A.

For instance, the example 2×2 grouping of photodiodes 304R depicted in FIG. 3B includes a 2×2 arrangement of photodiodes PD1, PD2, PD3, PD4, which are included in a pixel array under a common red color filter of a Quad Bayer filter disposed over the pixel array. The red color filter of a Quad Bayer filter is disposed between a single microlens (not illustrated) and 2×2 grouping of photodiodes 304R. In the example, the 2×2 arrangement of photodiodes PD1, PD2, PD3, PD4 is isolated within or surrounded by external side DTI grid structures 316E. Each of the photodiodes PD1, PD2, PD3, PD4 is isolated within respective openings defined by the external DTI grid structures 316E and the internal DTI grid structures 316I as shown. A center 318 of the 2×2 grouping of photodiodes 304R is located at an intersection of orthogonal interior side DTI grid structures 316I within the 2×2 grouping of photodiodes 304R.

As shown in the depicted example, a plurality of trench balance structures 314-1, 314-2, 314-3, 314-4 is disposed in the semiconductor layer. Each one of the plurality of trench balance structures 314-1, 314-2, 314-3, 314-4 is disposed in the semiconductor layer between a respective one of the photodiodes (e.g., PD1, PD2, PD3, PD4) and a respective one of the red color filters of the Quad Bayer CFA. In various examples, each trench balance structure 314-1, 314-2, 314-3, 314-4 that extends from a central region 328-1, 328-2, 328-3, 328-4 of a respective opening in the isolation grid 316 towards the center 318 of 2×2 grouping of photodiodes 304R. For instance, as shown in the depicted example, trench balance structure 314-1 extends from central region 328-1 towards center 318, trench balance structure 314-2 extends from central region 328-2 towards center 318, trench balance structure 314-3 extends from central region 328-3 towards center 318, and trench balance structure 314-4 extends from central region 328-4 towards center 318.

In various examples, each of the trench balance structures 314-1, 314-2, 314-3, 314-4 may have a length (e.g., distance between opposite ends of the trench balance structures 314-1, 314-2, 314-3, 314-4) of for example approximately 0.3 μm to 0.5 μm for a 1 μm pixel. In various examples, each of the trench balance structures 314-1, 314-2, 314-3, 314-4 may have a length that varies depending of the distance of the respective pixel from the center region of the pixel array. In the various examples, the width or critical dimension of each of the trench balance structures 314-1, 314-2, 314-3, 314-4 may be less than or equal to the width of the DTI grid structures 316I and 316E. In the various examples, the trench balance structures 314-1, 314-2, 314-3, 314-4 may be fabricated or formed with the same mask used to fabricate or form the DTI grid structures 316I and 316E or fabricated or formed separately using a different mask, for example for different trenches.

One of the differences between the example 2×2 grouping of photodiodes 304R of FIG. 3B and the example 2×2 grouping of photodiodes 304R of FIG. 3A is that in the example 2×2 grouping of photodiodes 304R shown in FIG. 3B, there is a gap or there is a central gap distance of that is greater than zero between trench balance structures 314-1, 314-2, 314-3, 314-4 and the intersection of the interior side DTI grid structures 316I at the center 318. For instance, in the example depicted in FIG. 3B, there is a central gap distance 330-1 between trench balance structure 314-1 and the center 318, a central gap distance 330-2 between trench balance structure 314-2 and the center 318, a central gap distance 330-3 between trench balance structure 314-3 and the center 318, and a central gap distance 330-4 between trench balance structure 314-4 and the center 318. In various examples, the central gap distances 330-1, 330-2, 330-3, and 330-4 may be for example approximately 0.2 µm. In various examples, the minimum central gap distances 330-1, 330-2, 330-3, and 330-4 may be determined based on processing design rules and the size of the corresponding pixel. In various examples, the smaller the central gap distances 330-1, 330-2, 330-3, and 330-4, the better the improvement on $G_B G_R$ differences.

Figure 4A:
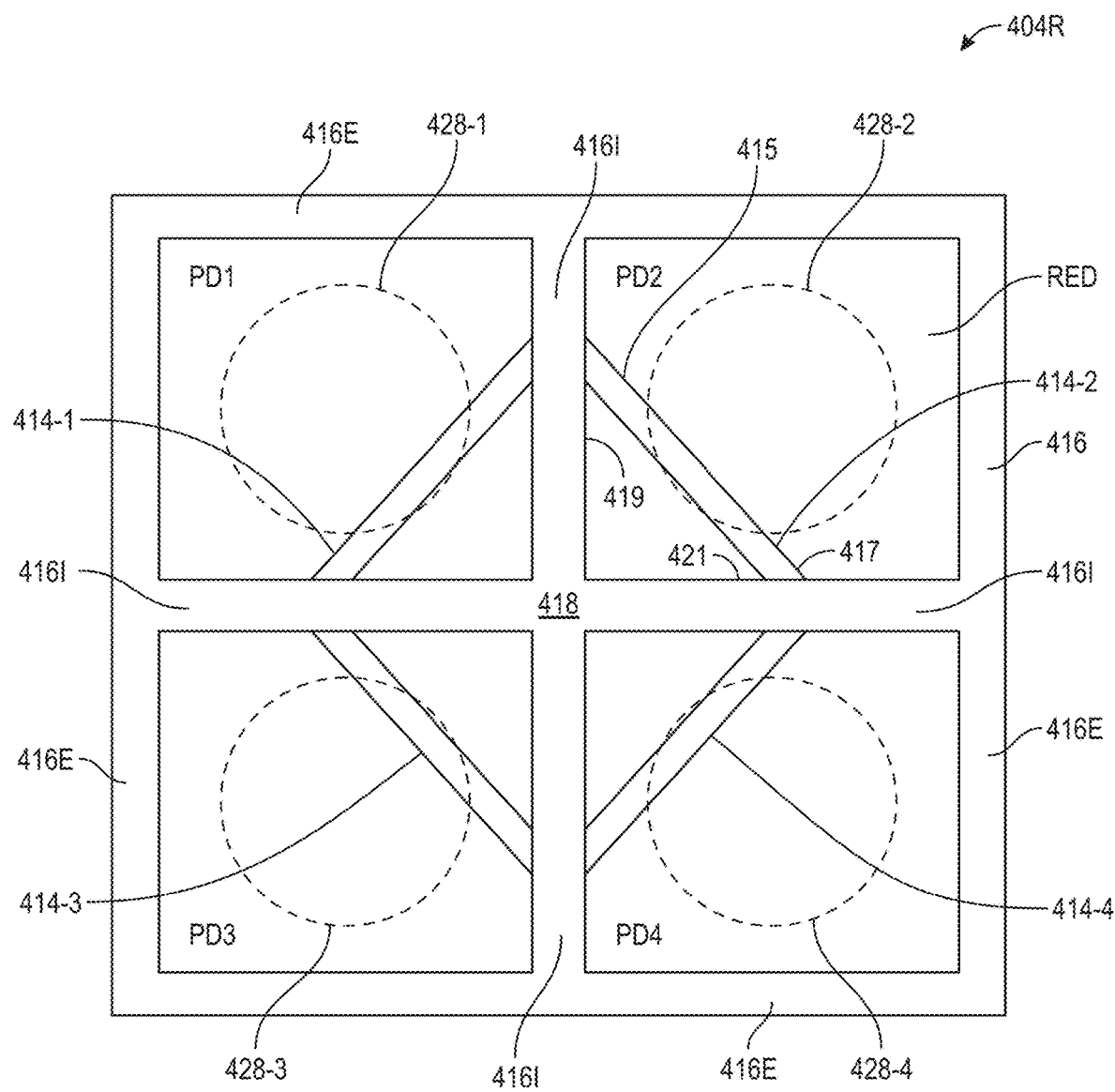
FIG. 4A is an example top view of a 2×2 grouping of photodiodes including yet another example of trench balance structures under a red color filter of a Quad Bayer filter in accordance with the teachings of the present disclosure.

FIG. 4A is an example top view illustrating increased detail of a 2×2 grouping of photodiodes 404R including yet another example of trench balance structures under a red color filter of a Quad Bayer filter in accordance with the teachings of the present disclosure. It is noted that the example 2×2 grouping of photodiodes 404R illustrated in FIG. 4A may be yet another example of the 2×2 grouping of photodiodes 204R of the example pixel array 202 of FIGS. 2A-2B or the 2×2 groupings of photodiodes 104R of the example pixel array 102 of FIG. 1 and it should be appreciated that similarly named and numbered elements referenced below are coupled and function as described above. In the example, the red color filter of a Quad Bayer filter is disposed between a single microlens (not illustrated) and 2×2 grouping of photodiodes 404R.

As shown in the depicted example, 2×2 grouping of photodiodes 404R includes a 2×2 arrangement of photodiodes PD1, PD2, PD3, PD4, which are included in a pixel array under a red color filter of a Quad Bayer filter disposed over the pixel array. In the example, the 2×2 arrangement of photodiodes PD1, PD2, PD3, PD4 is isolated within or surrounded by external side DTI grid structures 416E. Each of the photodiodes PD1, PD2, PD3, PD4 is isolated within respective openings defined by the external DTI grid structures 416E and the internal DTI grid structures 416I as shown. A center 418 of the 2×2 grouping of photodiodes 404R is located at an intersection of orthogonal interior side DTI grid structures 416I within the 2×2 grouping of photodiodes 404R.

As shown in the depicted example, a plurality of trench balance structures 414-1, 414-2, 414-3, 414-4 is disposed in the semiconductor layer. Each one of the plurality of trench balance structures 414-1, 414-2, 414-3, 414-4 is disposed in the semiconductor layer between a respective one of the photodiodes (e.g., PD1, PD2, PD3, PD4) and a respective one of the red color filters of the Quad Bayer CFA. As shown, each trench balance structure 414-1, 414-2, 414-3, 414-4 has a first end 415 and a second end 417 that is opposite the first end. In various examples, the first end 415 of each trench balance structure 414-1, 414-2, 414-3, 414-4 extends from a respective central region 428-1, 428-2, 428-3, 428-4 of a respective opening in the isolation grid towards a first side 419 of the respective opening in the isolation grid. In the depicted example, the sides (e.g., 419, 421) of the respective opening in the isolation grid are formed with internal DTI grid structures 416I as shown. Continuing with the example, the second end 417 (opposite the first end 415) of each trench balance structure 414-1, 414-2, 414-3, 414-4 extends from the respective central region 428-1, 428-2, 428-3, 428-4 of a respective opening in the isolation grid towards a second side 421 of the respective opening in the isolation grid. In the depicted example, the first side 419 and the second side 421 of the respective opening in the isolation grid are orthogonal internal DTI grid structures 416I and intersect at the center 418 as shown. In the depicted examples, each the plurality of trench balance structures 414-1, 414-2, 414-3, 414-4 and the corresponding internal DTI grid structures 416I may form a triangular shaped within a respective opening in the isolation grid 416.

In various examples, each of the trench balance structures 414-1, 414-2, 414-3, 414-4 may have a length (e.g., distance between first and second ends 415 and 417) of for example approximately 0.3 µm to 0.5 µm for a 1 µm pixel. In various examples, each of the trench balance structures 414-1, 414-2, 414-3, 414-4 may have a length that varies depending of the distance of the respective pixel from the center region of the pixel array. In the various examples, the width or critical dimension of each of the trench balance structures 414-1, 414-2, 414-3, 414-4 may be less than or equal to the width of the DTI grid structures 416I and 416E. In the various examples, the trench balance structures 414-1, 414-2, 414-3, 414-4 may be fabricated or formed with the same mask used to fabricate or form the DTI grid structures 416I and 416E or a different mask.

In the depicted example, there is no gap or there is a lateral gap distance equal to zero between trench balance structures 414-1, 414-2, 414-3, 414-4 and the interior side DTI grid structures 416I.

Figure 4B:
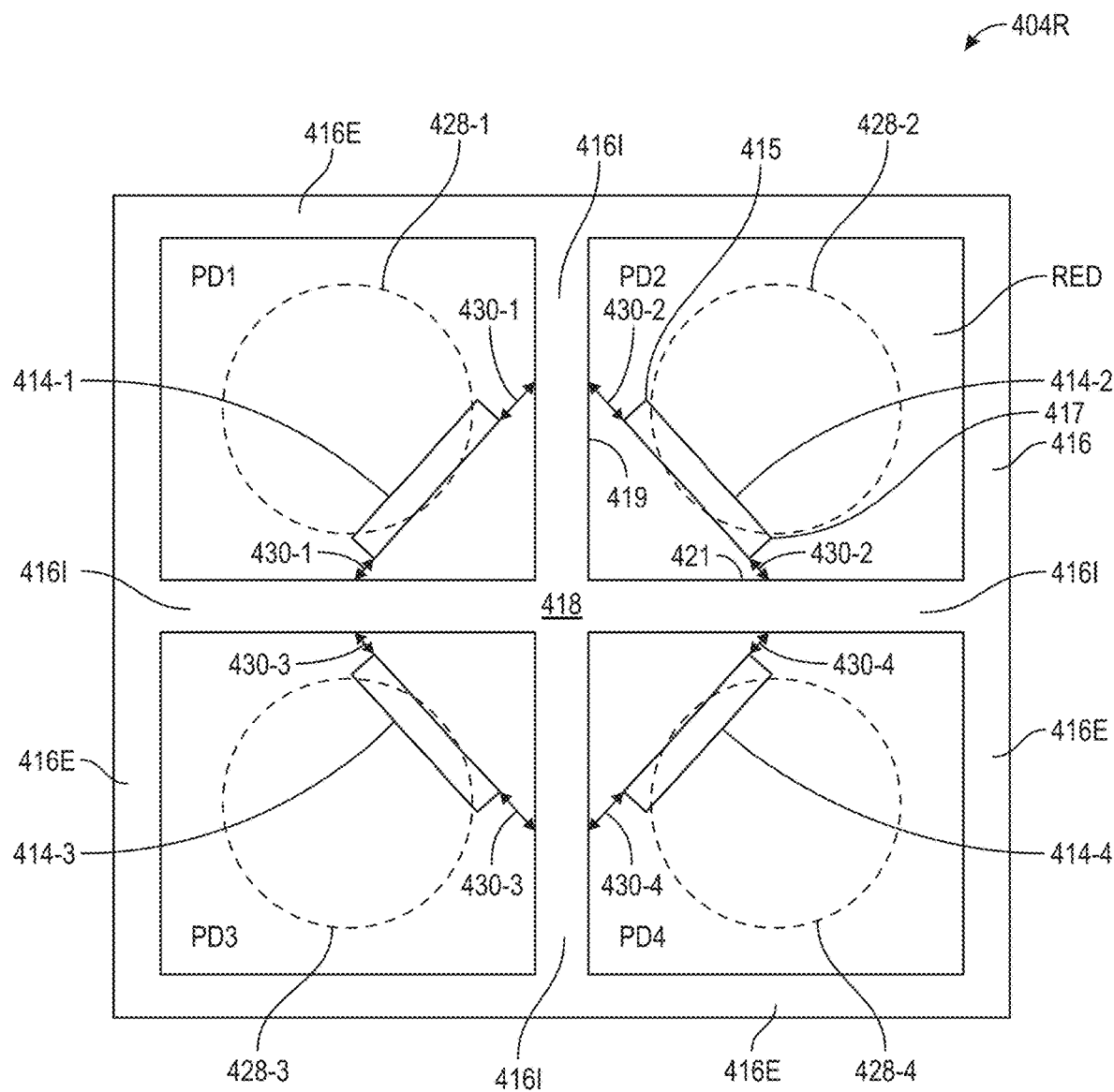
FIG. 4B is example top view of a 2×2 grouping of photodiodes including still another example of trench balance structures under a red color filter of a Quad Bayer filter in accordance with the teachings of the present disclosure.

FIG. 4B is example top view illustrating increased detail of a 2×2 grouping of photodiodes 404R including still another example of trench balance structures under a red color filter of a Quad Bayer filter in accordance with the teachings of the present disclosure. It is noted that the example 2×2 grouping of photodiodes 404R illustrated in FIG. 4B may be still another example of the 2×2 grouping of photodiodes 204R of the example pixel array 202 of FIGS. 2A-2B or the 2×2 groupings of photodiodes 104R of the example pixel array 102 of FIG. 1 and it should be appreciated that similarly named and numbered elements referenced below are coupled and function as described above. It is further appreciated that the example 2×2 grouping of photodiodes 404R of FIG. 4B shares many similarities with the example 2×2 grouping of photodiodes 404R of FIG. 4A.

For instance, the example 2×2 grouping of photodiodes 404R depicted in FIG. 4B includes a 2×2 arrangement of photodiodes PD1, PD2, PD3, PD4, which are included in a pixel array under a red color filter of a Quad Bayer filter disposed over the pixel array. In the example, the 2×2 arrangement of photodiodes PD1, PD2, PD3, PD4 is isolated within or surrounded by external side DTI grid structures 416E of isolation grid 416. Each of the photodiodes PD1, PD2, PD3, PD4 is isolated within respective openings defined by the external DTI grid structures 416E and the internal DTI grid structures 416I of isolation grid 416 as shown. A center 418 of the 2×2 grouping of photodiodes 404R is located at an intersection of orthogonal interior side DTI grid structures 4161 within the 2×2 grouping of photodiodes 404R.

As shown in the depicted example, a plurality of trench balance structures 414-1, 414-2, 414-3, 414-4 is disposed in the semiconductor layer. Each one of the plurality of trench balance structures 414-1, 414-2, 414-3, 414-4 is disposed in the semiconductor layer between a respective one of the photodiodes (e.g., PD1, PD2, PD3, PD4) and a respective one of the red color filters of the Quad Bayer CFA. As shown, each trench balance structure 414-1, 414-2, 414-3, 414-4 has a first end 415 and a second end 417 that is opposite the first end 415. In various examples, the first end 415 of each trench balance structure 414-1, 414-2, 414-3, 414-4 extends from a respective central region 428-1, 428-2, 428-3, 428-4 of a respective opening in the isolation grid towards a first side 419 of the respective opening in the isolation grid 416. In the depicted example, the sides (e.g., 419, 421) of the respective opening in the isolation grid 416 are formed with internal DTI grid structures 4161 as shown. Continuing with the example, the second end 417 (opposite the first end 415) of each trench balance structure 414-1, 414-2, 414-3, 414-4 extends from the respective central region 428-1, 428-2, 428-3, 428-4 of a respective opening in the isolation grid 416 towards a second side 421 of the respective opening in the isolation grid 416. In the depicted example, the first side 419 and the second side 421 of the respective opening in the isolation grid 416 are orthogonal internal DTI grid structures 4161 and intersect at the center 418 as shown.

In various examples, each of the trench balance structures 414-1, 414-2, 414-3, 414-4 may have a length (e.g., distance between opposite ends of the trench balance structures 414-1, 414-2, 414-3, 414-4) of for example approximately 0.3 μm to 0.5 μm for a 1 μm pixel. In various examples, each of the trench balance structures 414-1, 414-2, 414-3, 414-4 may have a length that varies depending of the distance of the respective pixel from the center region of the pixel array. In the various examples, the width or critical dimension of each of the trench balance structures 414-1, 414-2, 414-3, 414-4 may be less than or equal to the width of the DTI grid structures 4161 and 416E. In the various examples, the trench balance structures 414-1, 414-2, 414-3, 414-4 may be fabricated or formed with the same mask used to fabricate or form the DTI grid structures 4161 and 416E or a different mask.

One of the differences between the example 2×2 grouping of photodiodes 404R of FIG. 4B and the example 2×2 grouping of photodiodes 404R of FIG. 4A is that in the example 2×2 grouping of photodiodes 404R shown in FIG. 4B, there is a gap or there is a lateral gap distance of that is greater than zero between the first and second ends 415, 417 of trench balance structures 414-1, 414-2, 414-3, 414-4 and the respective interior side 419, 421 formed with DTI grid structures 4161. For instance, in the example depicted in FIG. 4B, there is a lateral gap distance 430-1 between the first and second ends 415, 417 of trench balance structure 414-1 and the respective interior side 419, 421 formed with DTI grid structures 4161, a lateral gap distance 430-2 between the first and second ends 415, 417 of trench balance structure 414-2 and the respective interior side 419, 421 formed with DTI grid structures 4161, a lateral gap distance 430-3 between the first and second ends 415, 417 of trench balance structure 414-3 and the respective interior side 419, 421 formed with DTI grid structures 4161, and a lateral gap distance 430-4 between the first and second ends 415, 417 of trench balance structure 414-4 and the respective interior side 419, 421 formed with DTI grid structures 4161. In various examples, the lateral gap distances 430-1, 430-2, 430-3, and 430-4 may be for example approximately 0.2 μm. In various examples, the minimum lateral gap distances 430-1, 430-2, 430-3, and 430-4 may be determined based on processing design rules. In various examples, the smaller the central gap distances 430-1, 430-2, 430-3, and 430-4, the better the improvement on $G_B G_R$ differences.

Figure 5:
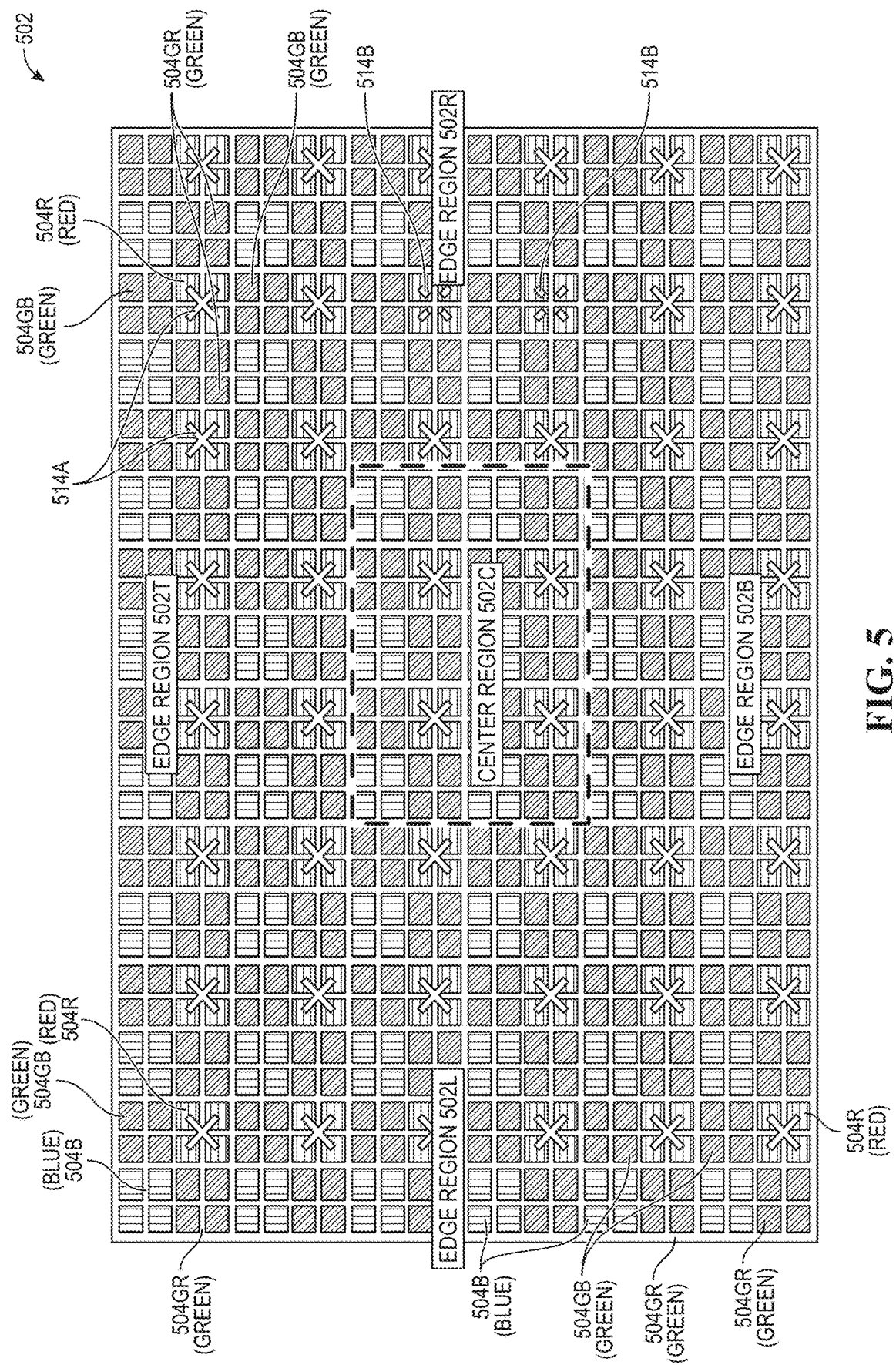
FIG. 5 illustrates center and edge regions of an example pixel array including various examples of trench balance structures included with at least some of the 2×2 groupings of photodiodes under red color filters of a Quad Bayer filter in accordance with the teachings of the present disclosure.

FIG. 5 illustrates center and edge regions of an example pixel array 502 including various examples of trench balance structures included with at least some of the 2×2 groupings of photodiodes under red color filters of a Quad Bayer filter in accordance with the teachings of the present disclosure. It is noted that the example pixel array 502 illustrated in FIG. 5 may be another example of pixel array 102 of FIG. 1, and it should be appreciated that similarly named and numbered elements referenced below are coupled and function as described above.

As shown in the example depicted in FIG. 5, pixel array 502 includes a center region 502C and end or edge regions including a top edge region 502T, a bottom edge region 502B, a left edge region 502L, and a right edge region 502R. The center region 502C and the edge regions 502T, 502B, 502L, 502R of pixel array 502 may be defined in terms of field of view, which is related to the size of pixel array 502 and an image height of an object. In one embodiment, the center region 502C may be defined as an imaging region of the pixel array 502 between a central field of view and a 0.05 field of view, and the peripheral region may be defined as an imaging region of the pixel array 502 greater than a 0.05 field of view. In the example, pixel array 502 is a two-dimensional (2D) array of pixel cells arranged into 2×2 groupings of photodiodes including a Quad Bayer color filter array (CFA) disposed over the plurality of 2×2 groupings of photodiodes. The Quad Bayer CFA includes red color filters, green color filters, and blue color filters, with each color filter of the Quad Bayer CFA is disposed over a respective one of the plurality of 2×2 groupings of photodiodes. In the depicted example, 2×2 groupings of photodiodes under red color filters are labeled 504R, 2×2 groupings of photodiodes under blue color filters are labeled 504B, 2×2 groupings of photodiodes under green color filters in the same row as red color filters are labeled 504GR, and 2×2 groupings of photodiodes under green color filters in the same row as blue color filters are labeled 504GB. The 2×2 groupings of photodiodes under red color filters 504R may be disposed neighboring to 2×2 groupings of photodiodes under green color filters in both row and column direction.

In various examples, a plurality of trench balance structures 514A, 514B as described in detail above are disposed in the semiconductor layer in 2×2 groupings of photodiodes between a respective photodiode and a respective one of the red color filters of the Quad Bayer CFA. In the various examples, none of the plurality of trench balance structures 514A, 514B are disposed between any of the photodiodes and respective green color filters ($G_R$ and/or $G_B$) or blue color filters of the Quad Bayer CFA. In some examples, it is appreciated that some of the 2×2 groupings of photodiodes under red color filters of the Quad Bayer CFA may or may not include respective trench balance structures 514A, 514B.

For instance, as shown in the example depicted in FIG. 5, trench balance structures 514A, 514B are not included in 2×2 groupings of photodiodes under red color filters in the center region 502C of pixel array 202. In particular, it is appreciated that at the center region 502C of pixel array 502, the chief ray angle (CRA) of incident light is zero degrees. As such, there is no $G_BG_R$ difference and trench balance structures 514A, 514B are therefore not needed to balance any $G_BG_R$ difference, which may enable center region 502C to have better color separation of a 2×2 groupings of photodiodes under red color filters (quad pixel cell) as trench balance structures 514A, 514B may induce non-uniformity sensitivity among corresponding 2×2 groupings of photodiodes. However, towards the edge regions of the pixel array 502, such as for example in the top, bottom, left, and right regions 502T, 502B, 502L, 502R, the CRA is increases, which increases the usefulness of trench balance structures 514A, 514B. As such, as shown in the depicted example, trench balance structures 514A, 514B are included in the 2×2 groupings of photodiodes under red color filters in the edge regions of the pixel array 502, such as for example in the top, bottom, left, and right regions 502T, 502B, 502L, 502R. In some embodiments, the arrangement (number, positions) of trench balance structures 514A, 514B for red color filters across pixel array may be determined in view of $G_BG_R$ difference level and color separation level.

However, it is appreciated that in some embodiments, it may be desirable to have the same trench balance structures such as trench balance structures 514A included in each one of 2×2 groupings of photodiodes under red color filters across the pixel array.

In various examples, it is appreciated that structural parameters including one or more of width, length, depth, center gap distance, and lateral gap distance of the trench balance structures 514A, 514B included in the 2×2 groupings of photodiodes under red color filters may vary across pixel array 202 based on needed $G_BG_R$ balance and improved color separation. As such, it is appreciated that the types of trench balance structures 514A, 514B may also vary across pixel array 502. For instance, as shown in the example depicted in FIG. 5, trench balance structures 514A illustrate trench balance structures similar to the examples described in FIG. 3A while trench balance structures 514B illustrate trench balance structures similar to the examples described in FIG. 3B. In the various examples, the lengths of each of the trench balance structures 514A, 514B may be configured differently depending on location of red pixel relative to the center region 502C and associated $G_BG_R$ difference. It is further appreciated that the trench balance structures included in the 2×2 groupings of photodiodes may include any one kind structure or a combination of trench balance structures illustrated in FIG. 2A, 3A, 3B, 4A and 4B depending on pixel size, placement in the pixel array, color separation performance, and/or $G_BG_R$ difference level.

The above description of illustrated examples of the present disclosure, including what is described in the Abstract, is not intended to be exhaustive or to limit the examples of the present disclosure to the precise forms disclosed. While specific examples of the present disclosure are described herein for illustrative purposes, various modifications are possible within the scope of the present disclosure, as those skilled in the relevant art will recognize.

These modifications can be made to the examples of the present disclosure in light of the above detailed description. The terms used in the following claims should not be construed to limit the examples of the present disclosure to the specific examples disclosed in the specification. Rather, the scope of the examples of the present disclosure is to be determined entirely by the following claims, which are to be construed in accordance with established doctrines of claim interpretation.

What is claimed is:

1. A pixel array, comprising:
   a plurality of 2×2 groupings of photodiodes in a semiconductor layer to generate image charge in response to incident light directed through a back side of the semiconductor layer;
   a Quad Bayer color filter array (CFA) disposed over the back side of the semiconductor layer over the plurality of 2×2 groupings of photodiodes, wherein the Quad Bayer CFA includes a plurality of color filters, wherein the plurality of color filters includes red color filters, green color filters, and blue color filters, wherein each color filter of the Quad Bayer CFA is disposed over a respective one of the plurality of 2×2 groupings of photodiodes; and
   a plurality of trench balance structures disposed in the semiconductor layer, wherein each one of the plurality of trench balance structures is disposed in the semiconductor layer between one of the photodiodes and a respective one of the red color filters of the Quad Bayer CFA, wherein none of the plurality of trench balance structures are disposed between any of the photodiodes and respective green color filters or blue color filters of the Quad Bayer CFA.

2. The pixel array of claim 1, further comprising a plurality of DTI grid structures disposed in the semiconductor layer and arranged to form an isolation grid in the semiconductor layer, wherein a plurality of openings are defined by the isolation grid, wherein each one of the photodiodes is isolated within a respective one of the plurality of openings defined by the isolation grid.

3. The pixel array of claim 2, wherein the plurality of trench balance structures includes a trench balance structure that extends from a central region of a respective opening in the isolation grid towards a center of a respective 2×2 grouping of photodiodes.

4. The pixel array of claim 3, wherein the trench balance structure is separated from an intersection of DTI grid structures at the center of the respective 2×2 grouping of photodiodes by a central gap distance.

5. The pixel array of claim 4, wherein the central gap distance is zero.

6. The pixel array of claim 2, wherein the plurality of trench balance structures includes a trench balance structure having a first end that is opposite a second end, wherein the first end extends from a central region of a respective opening in the isolation grid towards a first side of the respective opening in the isolation grid, wherein the second end extends from the central region of the respective opening in the isolation grid towards a second side of the respective opening in the isolation grid, wherein the first and second sides of the respective opening in the isolation grid intersect with a center of a respective 2×2 grouping of photodiodes.

7. The pixel array of claim 6, wherein the first and second ends of the trench balance structure are separated from the first and second sides of the respective opening in the isolation grid by lateral gap distances.

8. The pixel array of claim 7, wherein the lateral gap distances are zero.

9. The pixel array of claim 2, wherein the plurality of trench balance structures and the plurality of DTI grid structures comprise:
   a filling material disposed in the semiconductor layer; and
   a high-k lining material disposed between the filling material and the semiconductor layer.

10. The pixel array of claim 2, wherein a balance structure depth of the plurality of trench balance structures is less than or equal to a grid structure depth of the plurality of DTI grid structures.

11. The pixel array of claim 1, further comprising a microlens array disposed over the back side of the semiconductor layer over the plurality of 2×2 groupings of photodiodes, wherein each microlens of the microlens array is disposed over a respective one of the plurality of 2×2 groupings of photodiodes.

12. The pixel array of claim 1, wherein no trench balance structures are disposed in a center region of the pixel array.

13. The pixel array of claim 12, wherein each of the plurality of trench balance structures is disposed in an edge region of the pixel array.

14. The pixel array of claim 1, wherein each one of the plurality of trench balance structures is disposed in the semiconductor layer between one of the plurality of 2×2 groupings of photodiodes and the respective one of the red color filters that is neighboring another one of the 2×2 groupings of photodiodes disposed beneath one of the green color filters in a same row of the pixel array.

15. The pixel array of claim 1, wherein structural parameters including one or more of width, length, depth, center gap distance, and lateral gap distance of each one of the plurality of the trench balance structures vary across the pixel array.

16. An imaging system, comprising:
a pixel array including:
a plurality of 2×2 groupings of photodiodes in a semiconductor layer to generate image charge in response to incident light directed through a back side of the semiconductor layer;
a Quad Bayer color filter array (CFA) disposed over the back side of the semiconductor layer over the plurality of 2×2 groupings of photodiodes, wherein the Quad Bayer CFA includes a plurality of color filters, wherein the plurality of color filters includes red color filters, green color filters, and blue color filters, wherein each color filter of the Quad Bayer CFA is disposed over a respective one of the plurality of 2×2 groupings of photodiodes; and
a plurality of trench balance structures disposed in the semiconductor layer, wherein each one of the plurality of trench balance structures is disposed in the semiconductor layer between one of the photodiodes and a respective one of the red color filters of the Quad Bayer CFA, wherein none of the plurality of trench balance structures are disposed between any of the photodiodes and respective green color filters or blue color filters of the Quad Bayer CFA;
control circuitry coupled to the pixel array to control operation of the pixel array; and
readout circuitry coupled to the pixel array to read out image data from the pixel array.

17. The imaging system of claim 16, further comprising function logic coupled to the readout circuitry to store the image data read out from the pixel array.

18. The imaging system of claim 16, wherein the pixel array further comprises a plurality of DTI grid structures disposed in the semiconductor layer and arranged to form an isolation grid in the semiconductor layer, wherein a plurality of openings are defined by the isolation grid, wherein each one of the photodiodes is isolated within a respective one of the plurality of openings defined by the isolation grid.

19. The imaging system of claim 18, wherein the plurality of trench balance structures includes a trench balance structure that extends from a central region of a respective opening in the isolation grid towards a center of a respective 2×2 grouping of photodiodes.

20. The imaging system of claim 19, wherein the trench balance structure is separated from an intersection of DTI grid structures at the center of the respective 2×2 grouping of photodiodes by a central gap distance.

21. The imaging system of claim 20, wherein the central gap distance is zero.

22. The imaging system of claim 18, wherein the plurality of trench balance structures includes a trench balance structure having a first end that is opposite a second end, wherein the first end extends from a central region of a respective opening in the isolation grid towards a first side of the respective opening in the isolation grid, wherein the second end extends from the central region of the respective opening in the isolation grid towards a second side of the respective opening in the isolation grid, wherein the first and second sides of the respective opening in the isolation grid intersect with a center of a respective 2×2 grouping of photodiodes.

23. The imaging system of claim 22, wherein the first and second ends of the trench balance structure are separated from the first and second sides of the respective opening in the isolation grid by lateral gap distances.

24. The imaging system of claim 23, wherein the lateral gap distances are zero.

25. The imaging system of claim 18, wherein the plurality of trench balance structures and the plurality of DTI grid structures comprise:
a filling material disposed in the semiconductor layer; and
a high-k lining material disposed between the filling material and the semiconductor layer.

26. The imaging system of claim 18, wherein a balance structure depth of the plurality of trench balance structures is less than or equal to a grid structure depth of the plurality of DTI grid structures.

27. The imaging system of claim 16, wherein the pixel array further comprises a microlens array disposed over the back side of the semiconductor layer over the plurality of 2×2 groupings of photodiodes, wherein each microlens of the microlens array is disposed over a respective one of the plurality of 2×2 groupings of photodiodes.

28. The imaging system of claim 16, wherein no trench balance structures are disposed in a center region of the pixel array.

29. The imaging system of claim 28, wherein each of the plurality of trench balance structures is disposed in an edge region of the pixel array, wherein the edge region surrounds the center region.

30. The imaging system of claim 16, wherein each one of the plurality of trench balance structures is disposed in the semiconductor layer between one of the plurality of 2×2 groupings of photodiodes and the respective one of the red color filters that is neighboring another one of the 2×2 groupings of photodiodes disposed beneath one of the green color filters in a same row of the pixel array.

* * * * *